US010683587B2

(12) United States Patent
Yoshida

(10) Patent No.: US 10,683,587 B2
(45) Date of Patent: Jun. 16, 2020

(54) METHOD FOR MANUFACTURING NITRIDE CRYSTAL SUBSTRATE AND NITRIDE CRYSTAL LAMINATE

(71) Applicants: SCIOCS COMPANY LIMITED, Hitachi-shi, Ibaraki (JP); SUMITOMO CHEMICAL COMPANY, LIMITED, Tokyo (JP)

(72) Inventor: Takehiro Yoshida, Hitachi (JP)

(73) Assignees: SCIOCS COMPANY LIMITED, Hitachi-Shi (JP); SUMITOMO CHEMICAL COMPANY, LIMITED, Tokyo (JP)

(*) Notice: Subject to any disclaimer, the term of this patent is extended or adjusted under 35 U.S.C. 154(b) by 240 days.

(21) Appl. No.: 15/718,962

(22) Filed: Sep. 28, 2017

(65) Prior Publication Data
US 2018/0087185 A1 Mar. 29, 2018

(30) Foreign Application Priority Data
Sep. 29, 2016 (JP) ................. 2016-191749

(51) Int. Cl.
C30B 23/04 (2006.01)
C30B 25/20 (2006.01)
C30B 29/40 (2006.01)

(52) U.S. Cl.
CPC ............ C30B 25/20 (2013.01); C30B 29/406 (2013.01)

(58) Field of Classification Search
CPC ...... C30B 29/406; C30B 23/025; C30B 23/04
See application file for complete search history.

(56) References Cited

U.S. PATENT DOCUMENTS

2007/0138505 A1 6/2007 Preble et al.
2009/0194848 A1 8/2009 Uemura et al.
2009/0236694 A1 9/2009 Mizuhara et al.
(Continued)

FOREIGN PATENT DOCUMENTS

JP 2006-315947 A 11/2006
JP 2008-143772 A 6/2008
(Continued)

OTHER PUBLICATIONS

U.S. Office Action dated Dec. 17, 2018, for Copending U.S. Appl. No. 15/584,756.
(Continued)

Primary Examiner — Robert M Kunemund
(74) Attorney, Agent, or Firm — Birch, Stewart, Kolasch & Birch, LLP

(57) ABSTRACT

There is provided a method for manufacturing a nitride crystal substrate including: a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and a second step of growing a crystal film on the seed crystal substrate assembly, wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate.

6 Claims, 11 Drawing Sheets

(56) References Cited

U.S. PATENT DOCUMENTS

| | | |
|---|---|---|
| 2010/0322841 A1 | 12/2010 | Okahisa et al. |
| 2011/0260295 A1 | 10/2011 | Hirota et al. |
| 2012/0000415 A1 | 1/2012 | D'Evelyn et al. |
| 2012/0034149 A1 | 2/2012 | Fujiwara et al. |
| 2012/0112320 A1 | 5/2012 | Kubo et al. |
| 2012/0329245 A1 | 12/2012 | Uematsu et al. |
| 2015/0008563 A1 | 1/2015 | Mizuhara et al. |
| 2015/0203991 A1 | 7/2015 | Hashimoto et al. |
| 2017/0247813 A1 | 8/2017 | Yoshida |

FOREIGN PATENT DOCUMENTS

| | | |
|---|---|---|
| JP | 2011-26181 A | 2/2011 |
| JP | 2011-63504 A | 3/2011 |
| JP | 2012-1432 A | 1/2012 |
| JP | 2012-6772 A | 1/2012 |
| JP | 2012-31028 A | 2/2012 |
| JP | 2013-216528 A | 10/2013 |
| JP | 2014-62046 A | 4/2014 |
| JP | 2015-224143 A | 12/2015 |
| WO | WO 2009/096125 A1 | 8/2009 |
| WO | WO 2011/155341 A1 | 12/2011 |
| WO | WO 2015/182520 A1 | 12/2015 |

OTHER PUBLICATIONS

U.S. Office Action dated Aug. 28, 2019, for Copending U.S. Appl. No. 15/584,756.
U.S. Office Action for U.S. Appl. No. 15/584,756, dated Jan. 17, 2020.
U.S. Appl. No. 15/313,764, filed Nov. 23, 2016.
U.S. Appl. No. 15/361,226, filed Nov. 25, 2016.
U.S. Appl. No. 15/398,319, filed Jan. 4, 2017.
U.S. Appl. No. 15/584,756, filed May 2, 2017.

US 10,683,587 B2

METHOD FOR MANUFACTURING NITRIDE CRYSTAL SUBSTRATE AND NITRIDE CRYSTAL LAMINATE

BACKGROUND

Technical Field

The present disclosure relates to a method for manufacturing a nitride crystal substrate and a nitride crystal laminate.

Description of the Related Art

A substrate made of nitride crystal such as gallium nitride crystal for example (referred to as a nitride crystal substrate hereafter), is used when manufacturing a semiconductor device such as a light-emitting element and a high-speed transistor.

As a technique of forming the nitride crystal substrate having a large diameter and a large area, there is provided a technique of growing a crystal film on a substrate (referred to as a seed crystal substrate assembly hereafter) constituted by arranging and placing a plurality of seed crystal substrates made of nitride crystal so that side surfaces of the adjacent seed crystal substrates are in contact with each other, so as to integrate the crystal film grown on the adjacent seed crystal substrates, namely, so as to obtain the crystal film grown integrally over an entire surface of the seed crystal substrate assembly (for example, see patent document 1). However, in the abovementioned technique, defects are easily generated in the crystal film grown on a contact portion of the adjacent seed crystal substrates, and it is difficult to improve a quality of crystal.

Patent document 1: Japanese Patent Laid Open Publication No. 2015-224143

SUMMARY

An object of the present disclosure is to provide a technique capable of improving the quality of crystal of the crystal film grown on the contact portion of the adjacent seed crystal substrates, in a technique of growing the crystal film on the seed crystal substrate assembly.

According to an aspect of the present disclosure, there is provided a method for manufacturing a nitride crystal substrate including:

a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and a second step of growing a crystal film on the seed crystal substrate assembly, wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate.

According to other aspect of the present disclosure, there is provided a nitride crystal laminate including:

a seed crystal substrate assembly constituted by arranging and placing a plurality of seed crystal substrates which are made of nitride crystal and whose principal surfaces are c-planes, so that side surfaces of the adjacent seed crystal substrates are in contact with each other; and a crystal film grown on the seed crystal substrate assembly, wherein the crystal film is grown so that a continuous c-plane is formed on a contact portion of the adjacent seed crystal substrates.

According to the present disclosure, it is possible to improve the quality of crystal of the crystal film grown on the contact portion of the adjacent seed crystal substrates, in the technique of growing the crystal film on the seed crystal substrate assembly.

DETAILED DESCRIPTION OF THE DISCLOSURE

A First Embodiment of the Present Disclosure

A method for manufacturing a nitride crystal substrate according to a first embodiment of the present disclosure will be described.

First, a step of constituting a seed crystal substrate assembly 100 by arranging and placing a plurality of seed crystal substrates 110 on a base plate 200, will be described, with reference to FIG. 1 and FIG. 2A.

Figure 1:
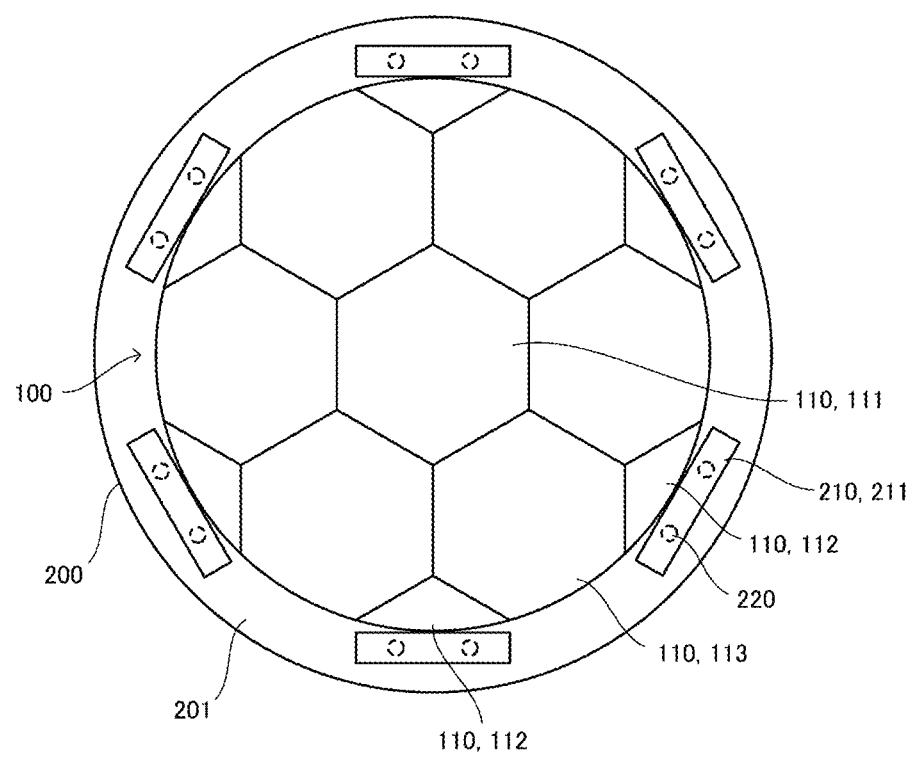
FIG. 1 is a schematic planar view showing a seed crystal substrate assembly placed on a base plate in a first embodiment of the present disclosure.

FIG. 1 is a schematic planar view showing the seed crystal substrate assembly 100 placed on the base plate 200. The seed crystal substrate assembly 100 is constituted by arranging and placing the plurality of seed crystal substrates 110 which are made of nitride crystal and whose principal surfaces are c-planes, on the base plate 200 so that side surfaces of the adjacent seed crystal substrates 110 are in contact with each other.

Here, explanation is given for a case that the nitride crystal is gallium nitride (GaN) crystal. However, the nitride crystal is not limited to the GaN crystal. For example, the nitride crystal may be aluminum nitride (AlN) crystal, aluminum gallium nitride (AlGaN) crystal, indium nitride (InN) crystal, indium gallium nitride (InGaN) crystal, or aluminum indium gallium nitride (AlInGaN) crystal, etc., namely, a crystal of a group III nitride semiconductor represented by a composition formula of $Al_xIn_yGa_{1-x-y}N$ ($0 \leq x+y \leq 1$).

The description of "a principal surface of a substrate is c-plane, namely, (0001) plane" means that an angle between a normal direction of the principal surface and a c-axis direction thereof is within ±1 degrees.

The term of "contact" means that surfaces of members are opposed in proximity to each other so as not allow a gap to occur between them, and does not mean that the surfaces of members are in complete contact with each other, namely, in contact with each other without the gap. The term of "proximity" means that a maximum width of the gap between the opposite portions is preferably 100 μm or less, and more preferably 50 μm or less, at room temperature (for example, 25° C.).

The seed crystal substrates 110 are placed on the base plate 200 in a state of regulating a position of the seed crystal substrates 110 in an in-plane direction by a position regulating unit 210 for regulating the position of the seed crystal substrates 110 in the in-plane direction (in a placing surface 201 of the base plate 200). Further, at least one of the seed crystal substrates 110 is placed non-adhesively to the base plate 200. The description such that the seed crystal substrates 110 "are placed non-adhesively to the base plate 200", refers to simply "are placed non-adhesively" in some cases.

In the first embodiment, fixing members 211 are used as the position regulating unit 210, which are placed on the base plate 200 so as to be in contact with an outer peripheral edge surface of the seed crystal substrate assembly 100, and which are adhered to a surface layer of the base plate 200. Further, all seed crystal substrates 110 constituting the seed crystal substrate assembly 100 are placed non-adhesively, due to use of the fixing members 211 which are prepared separately from the seed crystal substrates 110 as the position regulating unit 210.

Nitride crystal having the same composition with the seed crystal substrate 110 is preferably used as a material of the fixing member 211. This is because unnecessary stress is prevented from adding on a crystal film 140 described later grown on the seed crystal substrates 110, by growing the crystal film 140 on the fixing member 211 in the same manner as a growth on the seed crystal substrate 110, when growing the crystal film 140. Shape or size of the fixing member 211 is not particularly limited.

As a material constituting the base plate 200, it is preferable to use a material having heat-resistance and corrosion-resistance which can withstand a film-forming temperature and a film-forming atmosphere in a growth process of the crystal film 140 described later, and having a linear expansion coefficient equal to or smaller than the nitride crystal constituting the seed crystal substrate 110 or the crystal film 140. Here, the linear expansion coefficient of the nitride crystal means a coefficient of linear expansion in a direction parallel to c-plane of the seed crystal substrate 110, namely, in an a-axis direction. For example, a linear expansion coefficient of GaN crystal in the a-axis direction is $5.59 \times 10^{-6}$/K. By thus selecting the linear expansion coefficient of the material constituting the base plate 200, spreading of the gap formed between the adjacent seed crystal substrates 110 can be suppressed, when elevating a temperature in the growth process of the crystal film 140.

As the material constituting the base plate 200, it is further preferable to use a material with which the adhered fixing member 211 is released (separated) from the base plate 200 by peeling off the surface layer of the base plate 200, when growing the crystal film 140 described later, etc.

As a preferable material constituting the base plate 200 having such characteristics, for example, anisotropic graphite (pyrolytic graphite (PG), etc.), anisotropic boron nitride (pyrolytic boron nitride (PBN), etc.), and mica, etc., can be given. It is not necessary that the whole body (total thickness) of the base plate 200 is made of a material such as pyrolytic graphite. For example, the base plate 200 may also be constituted of a composite material which is obtained by coating a flat plate made of isotropic graphite, etc., which constitutes the placing surface 201, with pyrolytic graphite, etc.

As an adhesive agent 220 for adhering the fixing member 211 to the base plate 200, it is preferable to use an adhesive agent composed of a material having heat-resistance and corrosion-resistance which can withstand the film-forming temperature and the film-forming atmosphere in the growth process of the crystal film 140 described later, and having a linear expansion coefficient close to the nitride crystal constituting the seed crystal substrate 110 or the crystal film 140.

As such the adhesive agent 220, for example, heat-curing adhesive agent mainly composed of zirconia or silica, etc., can be used. More specifically, Aron Ceramic C-agent or E-agent (Aron Ceramic is a registered trademark) of TOAGOSEI Co., Ltd. can be given, for example. By using the heat-curing adhesive agent, there is an advantage that a position of an adhered member can be finely adjusted until drying of the adhesive agent is completed.

In an example shown in FIG. 1, the seed crystal substrate assembly 100 is constituted of a pattern in which a configuration of tessellating the regular-hexagonal seed crystal substrates 110 in a planar appearance, is circulary cut with a center of a predetermined seed crystal substrate 110 (111) as a center. Further, this pattern is a pattern constituted so that fan-shaped seed crystal substrates 110 (112) are placed at every other positions in the seed crystal substrates 110 arranged along a circumference which is an outer peripheral edge of the seed crystal substrate assembly 100.

An edge surface of each seed crystal substrate 110 defines sides of regular hexagon (namely, a rectilinear edge except for an arc portion), and the edge surface is preferably constituted so that a cleavage plane of M-plane is placed on a principal surface side, or so that a cleavage plane of a-plane is placed on the principal surface side. For example, each seed crystal substrate 110 can be prepared by cutting out from commercially available round-shaped nitride crystal substrate by laser scribing and cleaving from a side of a rear surface opposed to the principal surface, so as to constitute the seed crystal substrate assembly 100 by combining the cut-out substrates. An edge surface that defines the arc portion can be cut out by full cut using laser irradiation, and also can be cut out by laser scribing and cleaving.

By constituting the seed crystal substrate assembly 100 into a round-shape, for example, when a vapor phase growth is carried out by rotating the seed crystal substrate assembly 100 in a crystal growth apparatus described later, there is an advantage that uniformity of growth conditions such as a supply of a source gas in a circumferential direction of the seed crystal substrate assembly 100, can be enhanced, compared to a case in which the seed crystal substrate assembly 100 is a non-round-shape such as a rectangular-shape or a honeycomb-shape, for example.

In the example shown in FIG. 1, each fixing member 211 is placed so as to be in contact with an outer peripheral edge surface of each fan-shaped seed crystal substrate 112. Thereby, a movement of each fan-shaped seed crystal substrate 112 in a direction toward an outside of an outer periphery of the seed crystal substrate assembly 100 (an outer peripheral side direction), is regulated, and therefore a position of each substrate 112 in the in-plane direction is in a state of being regulated, even when each substrate 112 is placed non-adhesively.

The seed crystal substrate 110 (113) interposed between the most adjacent (the closest) two fan-shaped seed crystal substrates 112, is not in contact with the fixing member 211 in the seed crystal substrates 110 arranged along the outer peripheral edge of the seed crystal substrate assembly 100. But by locking the seed crystal substrate 110 (113) with the adjacent fan-shaped seed crystal substrates 112 on both sides, a movement of the substrate 113 toward the outer peripheral side direction is regulated, and therefore a position of the substrate 113 in the in-plane direction is in a state of being regulated, even when the substrate 113 is placed non-adhesively.

Further, by locking the seed crystal substrate 111 surrounded by the seed crystal substrates 112 and 113 which are arranged along the outer peripheral edge of the seed crystal substrate assembly 100, with the seed crystal substrates 112 and 113, a movement of the substrate 111 toward the outer peripheral side direction is regulated, and therefore a position of the substrate 111 in the in-plane direction is in a state of being regulated, even when the substrate 111 is placed non-adhesively.

Thus, all seed crystal substrates 110 constituting the seed crystal substrate assembly 100 can be placed on the base plate 200 in a state of regulating the position in the in-plane direction by the fixing members 211, even when the substrates 110 are placed non-adhesively.

By regulating the position of the fan-shaped seed crystal substrates 112 in the in-plane direction placed on an outer peripheral edge portion of the seed crystal substrate assembly 100, the position of other seed crystal substrate 110 in the in-plane direction can be regulated. It is preferable to place the fixing members 211 so as to regulate the position of the fan-shaped seed crystal substrate 112 in the in-plane direction, and thereby the number of the fixing members 211, namely, the number of adhesive portions can be reduced.

Figure 2A:
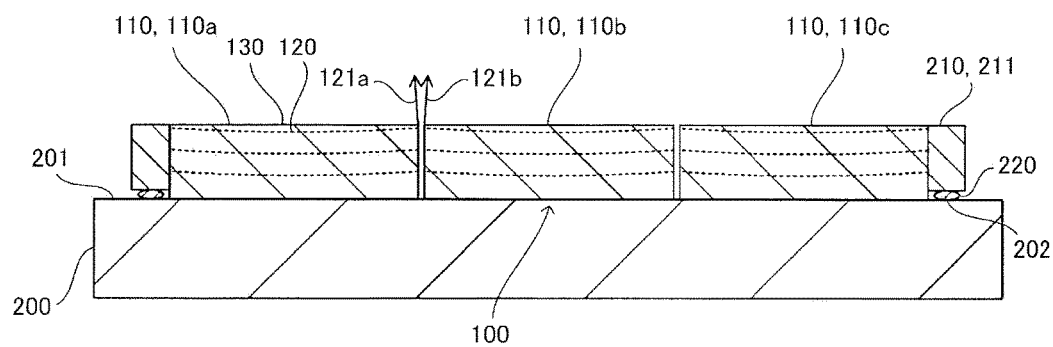
FIG. 2A is a schematic cross-sectional view showing a seed crystal substrate assembly placed on a base plate in a first embodiment.

FIG. 2A is a schematic cross-sectional view showing the seed crystal substrate assembly 100 placed on the base plate 200. A planar placement of the seed crystal substrates 110 of the seed crystal substrate assembly 100 is as shown in FIG. 1, for example. A positional relation between the seed crystal substrates 110 and the fixing members 211 in FIG. 2A differs from that of FIG. 1, in order to avoid complication of illustration and to facilitate explanation.

According to a current technique, it is difficult to obtain a nitride crystal having a completely planar c-plane without warpage. Accordingly, c-plane 120 of the seed crystal substrate 110 has convex warpage downward with respect to the principal surface 130 (toward the side of the base plate 200). Due to this configuration, in the adjacent seed crystal substrates 110, for example, seed crystal substrates 110a and 110b, a c-axis direction 121a on an edge portion where the seed crystal substrate 110a is in contact with the seed crystal substrate 110b, and a c-axis direction 121b on an edge portion where the seed crystal substrate 110b is in contact with the seed crystal substrate 110a, are mismatched by a predetermined angle according to size of warpage. In the adjacent seed crystal substrates 110 other than the seed crystal substrates 110a and 110b, a mismatching between c-axis directions exists as well.

Next, a step of growing the crystal film (nitride crystal film) 140 on the seed crystal substrate assembly 100 will be described, with reference to FIG. 2B.

Figure 2B:
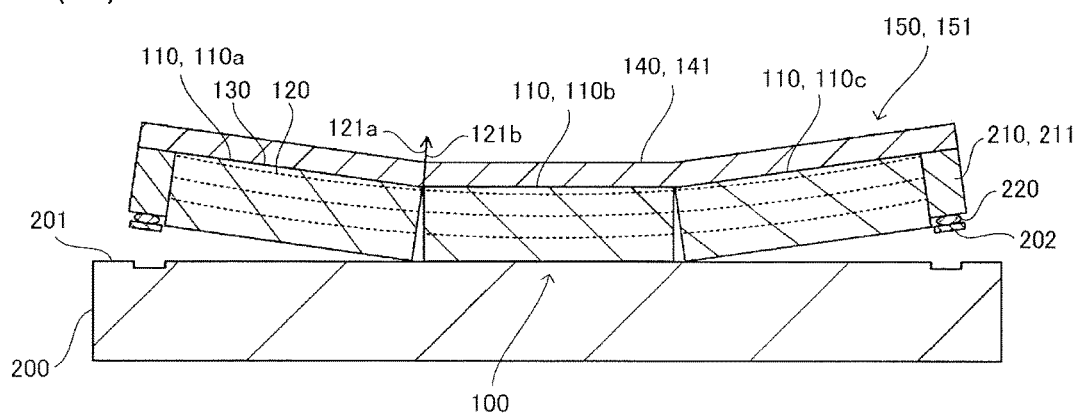
FIG. 2B is a schematic cross-sectional view showing a state of forming a crystal film on a seed crystal substrate assembly in a first embodiment.

FIG. 2B is a schematic cross-sectional view showing a state of forming the crystal film 140 on the seed crystal substrate assembly 100.

The seed crystal substrate assembly 100 placed on the base plate 200 as shown in FIG. 2A is loaded into the crystal growth apparatus, and held on a susceptor in a horizontal posture. For example, Hydride Vapor Phase Epitaxy (HVPE) apparatus is used as the crystal growth apparatus. A temperature of the seed crystal substrate assembly 100 is elevated to the film-forming temperature, for example, about 1000° C. to 1100° C., and a gallium chloride (GaCl) gas and an ammonia (NH$_3$) gas for example are supplied as the source gas, and thereby the crystal film 140 is grown on the seed crystal substrate assembly 100. In order to enhance uniformity of a film thickness of the crystal film 140, it is preferable to grow the crystal film 140 in a state of rotating the susceptor.

The process of elevating the temperature of the seed crystal substrate assembly 100 is started in a state as shown in FIG. 2A. Each seed crystal substrate 110 is thermally expanded, and the seed crystal substrate assembly 100 is thermally expanded toward the outer peripheral side direction, when elevating the temperature. Here, although the adjacent seed crystal substrates 110 are placed so that their side surfaces are in contact with each other, their side surfaces are not actually complete planar surfaces, and therefore a certain degree of the gap exists between their side surfaces (even in a case that a contact portion exists between them). Thermal expansion at the time of elevating the temperature, is an expansion that allows the abovementioned gap to be narrowed, is not an excessive expansion toward the outer peripheral side direction of the seed crystal substrate assembly 100, and is not an expansion resulting in release of an adhesion of the fixing member 211 from the base plate 200 by being pushed by the seed crystal substrate assembly 100. Namely, a state of regulating the positions of the seed crystal substrates 110 in the in-plane direction by the fixing members 211, is maintained even when elevating the temperature.

Thus, by using the fixing member 211, a misalignment of the position of each seed crystal substrate 110 in the in-plane direction can be suppressed due to shock which occurs when loading the seed crystal substrate assembly 100 into the crystal growth apparatus, or vibration which occurs when rotating the seed crystal substrate assembly 100, etc., and the growth of the crystal film 140 can be started in a state that the adjacent seed crystal substrates 110 are in appropriate contact with each other.

Each seed crystal substrate 110 is placed non-adhesively to the base plate 200, and therefore a movement of the substrate 110 toward a direction (a inclination direction) in which the principal surfaces 130 are inclined, is allowed (it can also be said that the movement of the substrate 110 toward a thickness direction is allowed). Therefore, at least one of the adjacent seed crystal substrates 110, for example, the seed crystal substrates 110a and 110b (the seed crystal substrate 110a in this example) can move autonomously toward the inclination direction so as to be reduced the mismatching between the c-axis direction 121a and the c-axis direction 121b. Due to the autonomous movement of the seed crystal substrate 110a toward the inclination direction, the crystal film 140 can be grown on the seed crystal substrates 110a and 110b so that the c-axis directions 121a and 121b of the adjacent seed crystal substrates 110a and 110b are matched with each other, namely, so that the c-plane 120 of the seed crystal substrate 110a and the c-plane 120 of the seed crystal substrate 110b are placed on the same spherical surface. In FIG. 2B, etc., an inclination angle is exaggerated in order to facilitate illustration.

Thereby, the crystal film 140 can be grown on a contact portion of the adjacent seed crystal substrates 110a and 110b so that a continuous c-plane is formed over the surface from the seed crystal substrate 110a to the seed crystal substrate 110b, and a formation of irregularities (V-grooves in comparative embodiment described later) on a surface of the crystal film 140 can be suppressed.

The crystal film 140 can be similarly grown on the adjacent seed crystal substrates 110 other than the seed crystal substrates 110a and 110b, and the crystal film 140 integrally grown over an entire surface of the seed crystal substrate assembly 100, can be obtained.

In examples shown in FIG. 2A and FIG. 2B, the seed crystal substrate 110a and a seed crystal substrate 110c are symmetrically placed on an outer peripheral side of the seed crystal substrate assembly 100, interposing the seed crystal substrate 110b placed at a center of the seed crystal substrate assembly 100. Therefore, this example is an example in which the seed crystal substrate 110a and the seed crystal substrate 110c symmetrically move toward the inclination direction with the seed crystal substrate 110b as a center. The seed crystal substrates 110a and 110c move toward the inclination direction so that outer peripheral side portions of the respective seed crystal substrates 110a and 110c becomes higher than a central side portions.

By reducing variations in a curvature radius of the c-plane of each seed crystal substrate 110 constituting the seed crystal substrate assembly 100, the crystal film 140 can be grown so that the continuous c-plane is formed over all adjacent seed crystal substrates 110.

The average curvature radius of the c-planes of the seed crystal substrates 110 constituting the seed crystal substrate assembly 100, is preferably as large as possible, in order to minimize the movement of the seed crystal substrate 110 toward the inclination direction, and enhance a flatness (reduce a warpage) of the crystal film 140 to be formed. Namely, the seed crystal substrates 110 constituting the seed crystal substrate assembly 100, is preferably a low warpage substrate as much as possible. The average curvature radius of the c-planes of the seed crystal substrates 110 constituting the seed crystal substrate assembly 100, is preferably 10 meters or more, and more preferably 20 meters or more, for example.

As described above, by using the fixing member 211 (the position regulating unit 210), the growth of the crystal film 140 can be started in a state of regulating the position of the seed crystal substrate 110 in the in-plane direction. Namely, the growth of the crystal film 140 can be started in a state that the adjacent seed crystal substrates 110 are in appropriate contact with each other and positioning error is suppressed.

Then, the movement of the seed crystal substrate 110 toward the inclination direction is allowed by placing it non-adhesively, and thereby the crystal film 140 can be grown so that the continuous c-plane is formed on the contact portion of the adjacent seed crystal substrates 110 and the formation of the irregularities (V-grooves) on the surface is suppressed. Namely, it is possible to obtain the crystal film 140 having a large diameter, a large area, and a high quality of having the continuous c-plane over the entire surface of the seed crystal substrate assembly 100 and suppressing the irregularities (V-grooves) on the surface.

Here, a method for manufacturing a nitride crystal substrate according to a comparative embodiment will be described, with reference to FIG. 10 to FIG. 11B.

Figure 10:
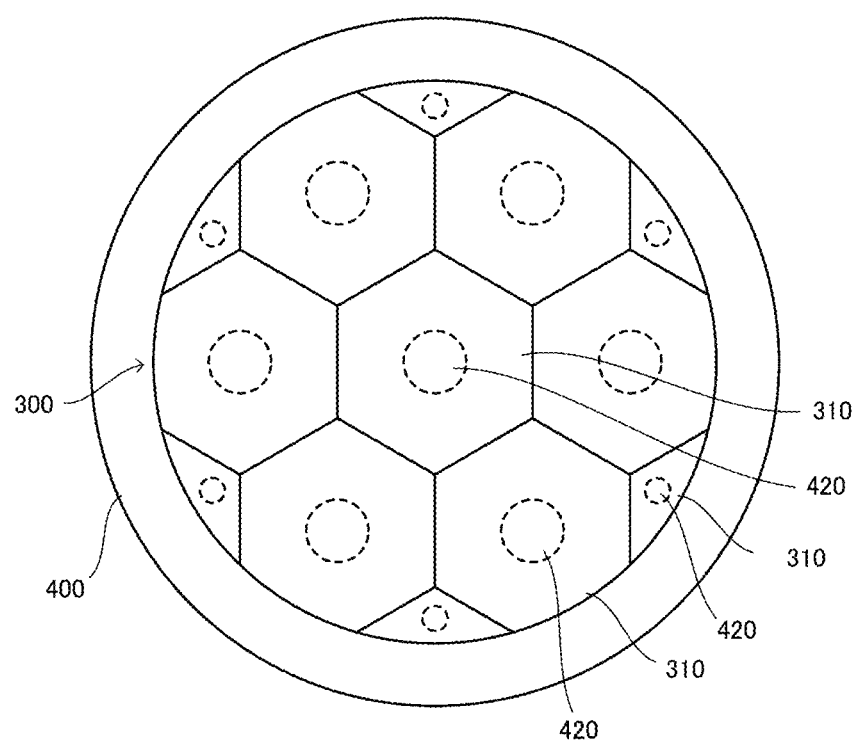
FIG. 10 is a schematic planar view showing a seed crystal substrate assembly placed on a base plate in a comparative embodiment.
Figure 11A:
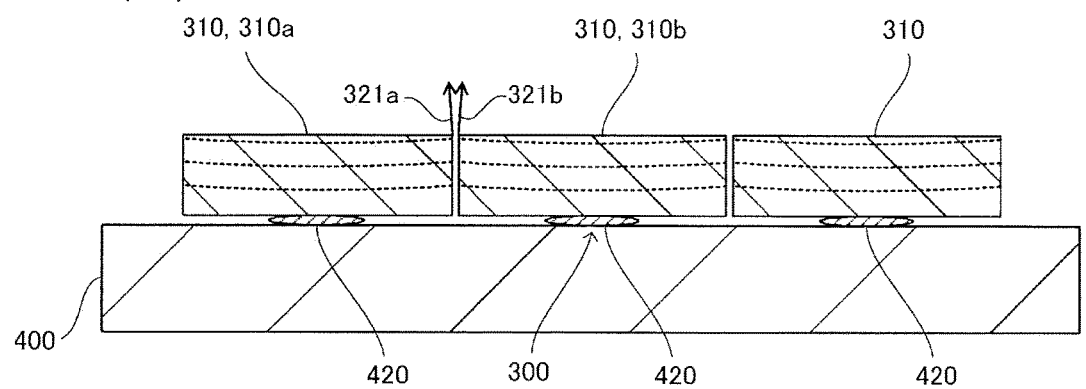
FIG. 11A is a schematic cross-sectional view showing a seed crystal substrate assembly placed on a base plate in a comparative embodiment.

FIG. 10 is a schematic planar view showing a seed crystal substrate assembly 300 placed on a base plate 400, and FIG. 11A is a schematic cross-sectional view thereof. FIG. 11B is a schematic cross-sectional view showing a state of forming a crystal film 340 on the seed crystal substrate assembly 300.

A difference point from the first embodiment is that all seed crystal substrates 310 are adhered to the base plate 400 by an adhesive agent 420. Therefore, positions of all seed crystal substrates 310 in an in-plane direction are regulated, and a movement of the substrate 310 toward the inclination direction is regulated.

Figure 11B:
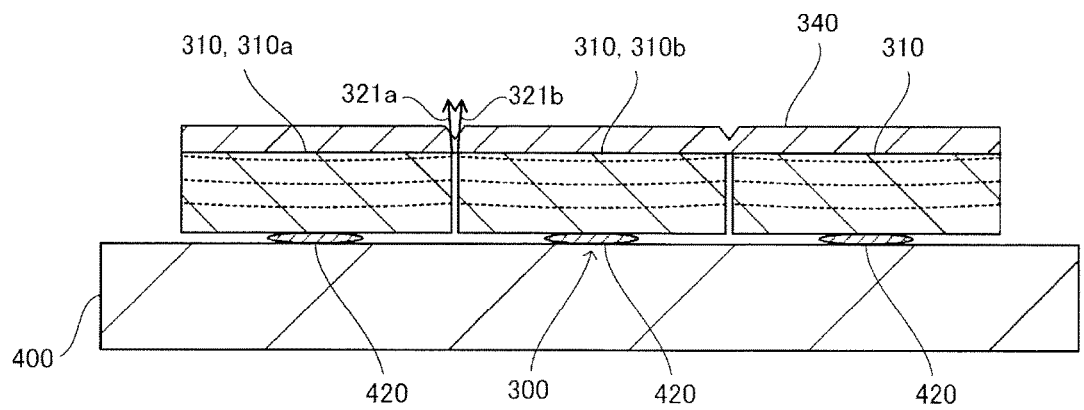
FIG. 11B is a schematic cross-sectional view showing a state of forming a crystal film on a seed crystal substrate assembly in a comparative embodiment.

Therefore, in the comparative embodiment, as shown in FIG. 11B, the seed crystal substrates 310 can not move toward the inclination direction when growing the crystal film 340, to thereby grow the crystal film 340 in a state in which c-axis directions of the adjacent seed crystal substrates 310, for example, c-axis directions 321a and 321b of seed crystal substrates 310a and 310b are mismatched. As a result, the crystal film 340 whose c-plane is discontinuous, is grown on a contact portion of the adjacent seed crystal substrates 310, and V-grooves (irregularities) are formed on a surface of the crystal film 340.

The first embodiment of the present disclosure will be further described, with reference to FIG. 1 to FIG. 2B again.

As described above, by growing the crystal film 140 over the adjacent seed crystal substrates 110, it is possible to obtain the crystal film 140 which is grown integrally on the entire surface of the seed crystal substrate assembly 100. Namely, the adjacent seed crystal substrates 110 are (the seed crystal substrate assembly 100 is) combined integrally through the crystal film 140. Therefore, after starting the growth of the crystal film 140, the misalignment of the adjacent seed crystal substrates 110 does not occur, and it is not necessary to regulate the position of the substrates 110 in the in-plane direction by the fixing members 211.

The fixing member 211 is fixedly attached to the seed crystal substrate 110 which is in contact with the fixing member 211, for example, the seed crystal substrate 110a by forming the crystal film 140 on the fixing member 211 as well. Therefore, a force for lifting the fixing member 211 upward (an opposed side of the base plate 200), acts on the fixing member 211, when moving the seed crystal substrate 110a toward the inclination direction, with the growth of the crystal film 140 on the seed crystal substrate 110a. Then, due to this force, a surface layer 202 of the base plate 200 to which the fixing member 211 is adhered by the adhesive agent 220, is peeled off (as a sacrificial layer), and the fixing member 211 is released (separated) from the base plate 200. The situation that "a member which is adhered to the surface layer 202 of the base plate 200 by the adhesive agent 220, is released from the base plate 200 by peeling off the surface layer 202" is called "the adhesion of the member is released".

Thus, when the fixing member 211 is released from the base plate 200, a function for regulating the position of the seed crystal substrate 110 in the in-plane direction, is lost. However there is particularly no problem, because it is not necessary to regulate the position of the substrate 110 in the in-plane direction after starting the growth of the crystal film 140. Further, by having a configuration so that the fixing member 211 can be released from the base plate 200 after starting the growth of the crystal film 140, the movement of the seed crystal substrate 110 which is in contact with the fixing member 211 toward the inclination direction, is hardly inhibited, and the crystal film 140 having high quality can be easily obtained. The number of the fixing members 211, namely, the number of the adhesive portions is preferably minimized, so that the movement of the seed crystal substrate 110 toward the inclination direction, is hardly inhibited.

A force required for releasing the fixing member 211 from the base plate 200, namely, a force required for peeling off the surface layer 202, becomes larger as the surface layer 202 to be released becomes larger, namely, as an area (an adhesion area) where the adhesive agent 220 is placed, is larger. Therefore, by adjusting the adhesion area of the adhesive agent 220, it is possible to appropriately adjust a manner of releasing the fixing member 211 from the base plate 200 so that the fixing member 211 is adhered to the base plate 200 (so that a state of regulating the position of the seed crystal substrate 110 in the in-plane direction by the fixing member 211, is maintained) when starting the growth of the crystal film 140, and so that the fixing member 211 is released from the base plate 200 after starting the growth of the crystal film 140.

When a warpage of the seed crystal substrate 110 is excessively small, there is sometimes a case in which the adhesion of the fixing member 211 is not released upward when growing the crystal film 140. In such a case, when a laminate (nitride crystal laminate) 150 of the seed crystal substrate assembly 100 and the crystal film 140 is thermally contracted while lowering the temperature after growing the crystal film 140, the fixing member 211 is moved in a lateral side direction toward a central side, and thereby there is sometimes a case in which the surface layer 202 is peeled off, and the adhesion of the fixing member 211 is released. Further, there is also a case in which the adhesion of the fixing member 211 is not released, even when lowering the temperature after growing the crystal film 140, is ended. In such a case, the adhesion of the fixing member 211 can be released by peeling off the laminate 150 from the base plate 200 together with the fixing member 211 (namely, the laminate 150 can be released from the base plate 200 and can be free-standing).

The crystal film 140 having a desired thickness can be obtained by further growing a crystal film on the crystal film 140 which is formed over the entire surface of the seed crystal substrate assembly 100. The crystal film 140 whose thickness reaches a thickness having a strength with which the integrally combined seed crystal substrate assembly 100, namely, the laminate 150 can be free-standing (can be subjected to processing such as cleaning independently), is called a combining thin film 141. A thickness of the combining thin film 141 is, for example, 350 µm or more.

By slicing the crystal film 140 which is a thick film grown to a desired thickness, the nitride crystal substrate can be obtained. Hereafter, some examples of a method for obtaining the nitride crystal substrate will be described, with reference to FIG. 3A and FIG. 3B.

Figure 3A:
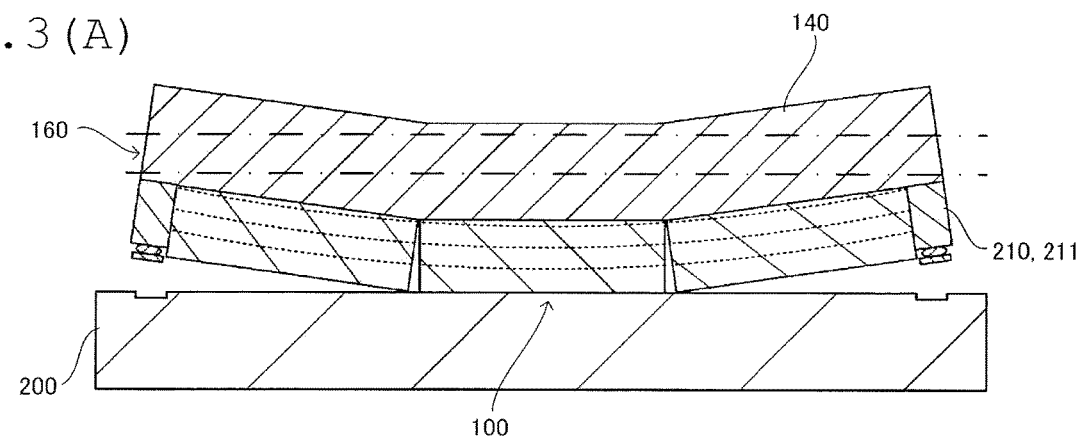
FIG. 3A and FIG. 3B are respectively schematic cross-sectional views showing an example or another example of a method for obtaining a nitride crystal substrate by growing and slicing a thick crystal film.

FIG. 3A is a schematic cross-sectional view showing a first method. The crystal film 140 is grown thicker by using the same crystal growth apparatus (for example, HVPE apparatus) from a state shown in FIG. 2B, and a nitride crystal substrate 160 can be obtained by slicing the thickened crystal film 140.

Figure 3B:
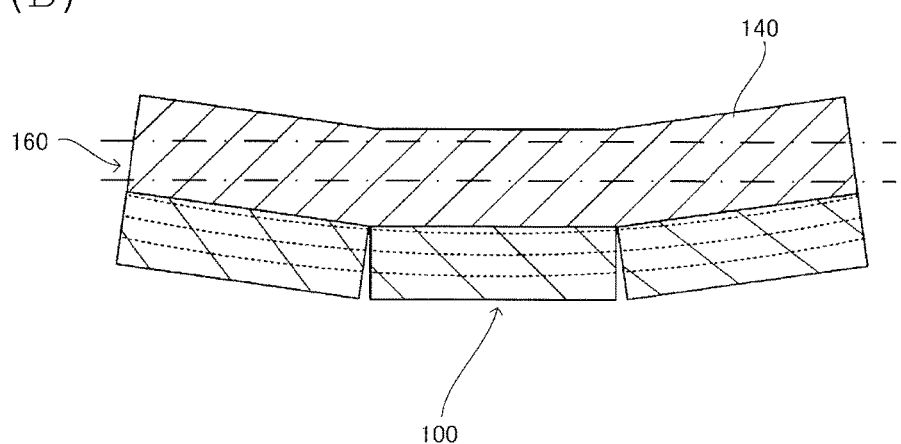

FIG. 3B is a schematic cross-sectional view showing a second method. The crystal film 140 (the combining thin film 141) is grown as shown in FIG. 2, and thereafter the base plate 200, and the laminate 150 of the seed crystal substrate assembly 100 and the combining thin film 141, are unloaded from the crystal growth apparatus. The laminate 150 of the seed crystal substrate assembly 100 and the combining thin film 141, is called a substrate for crystal growth 151 in some cases.

The fixing member 211 is fixedly attached to an outer periphery of the substrate for crystal growth 151 at the time of unloading from the crystal growth apparatus. The fixing member 211 is removed from the substrate for crystal growth 151, and a required cleaning process, etc., is performed, and thereafter the substrate for crystal growth 151 is loaded into other crystal growth apparatus, for example, a crystal growth apparatus designed for an ammonothermal method, a crystal film is further grown on the combining thin film 141, and the nitride crystal substrate 160 can be obtained by slicing the thickened crystal film 140.

A First Modified Example of the First Embodiment

Next, a method for manufacturing a nitride crystal substrate according to a first modified example of the first embodiment will be described, with reference to FIG. 4A and FIG. 4B.

Figure 4A:
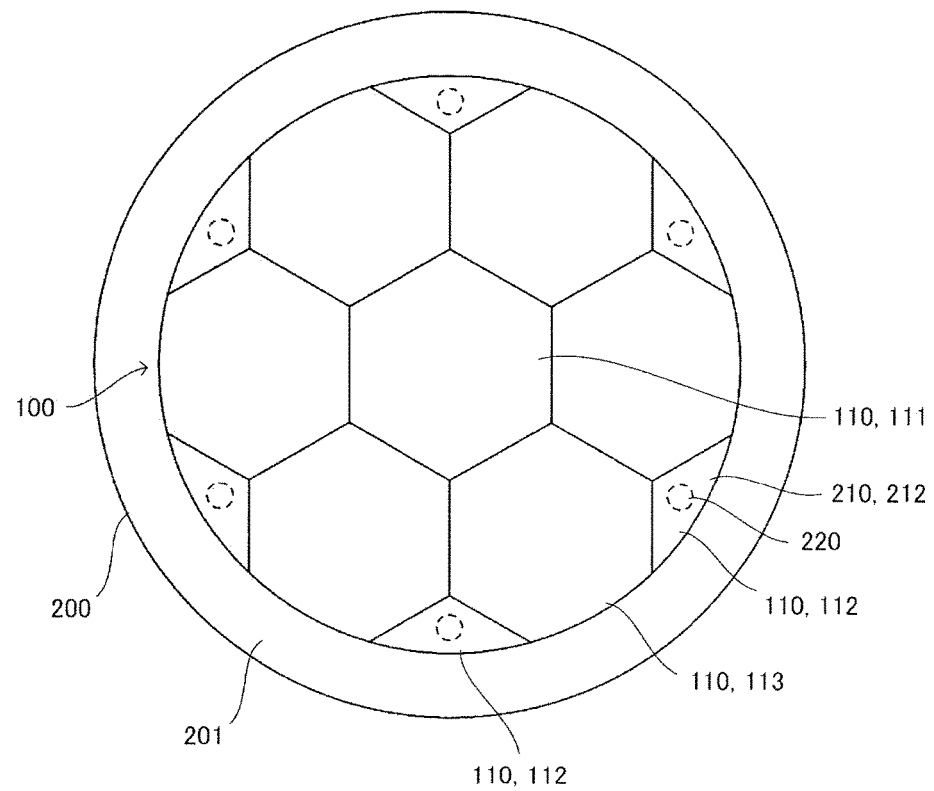
FIG. 4A is a schematic planar view showing a seed crystal substrate assembly placed on a base plate in a first modified example of a first embodiment.
Figure 4B:
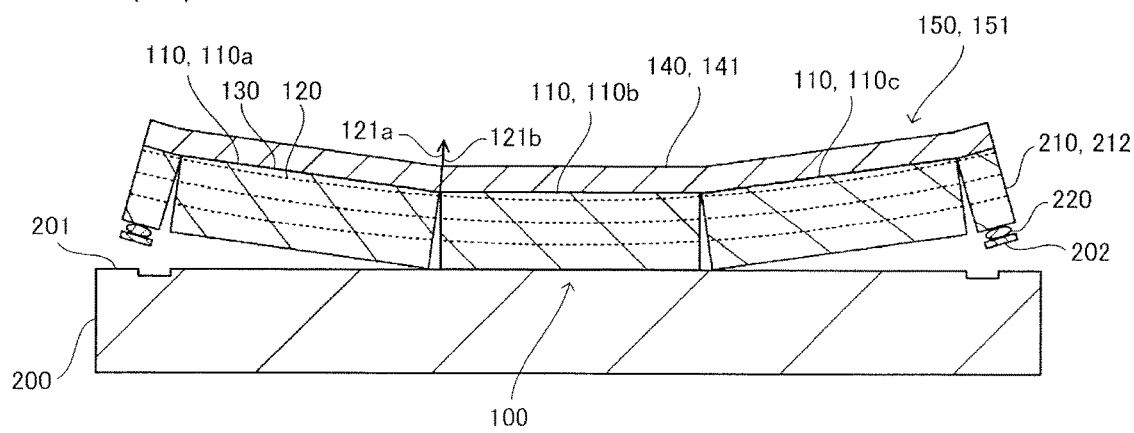
FIG. 4B is a schematic cross-sectional view showing a state of forming a crystal film on a seed crystal substrate assembly in a first modified example of a first embodiment.

FIG. 4A is a schematic planar view showing the seed crystal substrate assembly 100 placed on the base plate 200. FIG. 4B is a schematic cross-sectional view showing a state of forming the crystal film 140 on the seed crystal substrate assembly 100.

In the abovementioned first embodiment, explanation has been given for the example in which the fixing member 211 prepared separately from the seed crystal substrates 110, is used as the position regulating unit 210, and all seed crystal substrates 110 constituting the seed crystal substrate assembly 100 are placed non-adhesively.

In the first modified example, a seed crystal substrate for fixing 212 which is the seed crystal substrate 110 placed on the outer peripheral edge portion of the seed crystal substrate assembly 100, and which is adhered to the surface layer 202 of the base plate 200, is used as the position regulating unit 210. Further, the seed crystal substrates 110 other than the seed crystal substrate for fixing 212 among the seed crystal substrates 110 constituting the seed crystal substrate assembly 100, are placed non-adhesively, due to use of the seed crystal substrate for fixing 212 as the position regulating unit 210.

Preferably, the fan-shaped seed crystal substrates 112 which are placed at every other positions in the seed crystal substrates 110 arranged along the circumference which is the outer peripheral edge of the seed crystal substrate assembly 100, are used as the seed crystal substrate for fixing 212.

By placing adhesively the fan-shaped seed crystal substrates 112, namely, placing in a state of regulating the position of the substrate 112 in the in-plane direction, the positions of other seed crystal substrates 110 (113, 111) in the in-plane direction are in a state of being regulated, even when the substrates 110 (113, 111) are placed non-adhesively, as described in the abovementioned first embodiment.

The seed crystal substrate for fixing 212 is constituted as the position regulating unit 210 adhered to the base plate 200, and meanwhile constitutes a part of the seed crystal substrate assembly 100. Therefore, it is preferable to constitute the seed crystal substrate for fixing 212 so as to release an adhesion (peel off the surface layer 202 of the base plate 200) when growing the crystal film 140, and so as to move toward the inclination direction.

By adjusting an adhesion area of the adhesive agent 220 for adhering the seed crystal substrate for fixing 212 to the base plate 200, it is possible to appropriately adjust a manner of releasing the seed crystal substrate for fixing 212 from the base plate 200 so that the seed crystal substrate for fixing 212 is adhered to the base plate 200 (so that a state of regulating the position of other seed crystal substrate 110 in the in-plane direction by the seed crystal substrate for fixing 212, is maintained) when starting the growth of the crystal film 140, and so that the seed crystal substrate for fixing 212 is released from the base plate 200 after starting the growth of the crystal film 140. An adhesive agent similar to the abovementioned first embodiment can be used as the adhesive agent 220.

By using the seed crystal substrate for fixing 212, namely, the seed crystal substrate 110 as the position regulating unit 210, it is not necessary to prepare a member separately from the seed crystal substrate 110 as the position regulating unit 210.

The fan-shaped seed crystal substrate 112 is preferably used as the seed crystal substrate for fixing 212, and thereby the number of the seed crystal substrates for fixing 212 required for regulating the position of other seed crystal substrate 110 which is placed non-adhesively in the in-plane direction, namely, the number of the adhesive portions can be reduced. The number of the seed crystal substrates for fixing 212, namely, the number of the adhesive portions is preferably minimized, so that the movement of the seed crystal substrate for fixing 212 toward the inclination direction, is hardly inhibited.

In the first modified example as well, similarly to the abovementioned first embodiment, the growth of the crystal film 140 can be started in a state of regulating the position of the seed crystal substrates 110 in the in-plane direction by the seed crystal substrate for fixing 212 (the position regulating unit 210).

Then, the seed crystal substrate 110 other than the seed crystal substrate for fixing 212 is placed non-adhesively, the movement of the seed crystal substrate for fixing 212 toward the inclination direction is allowed by releasing the adhesion of the substrate 212 due to start of the growth of the crystal film 140, and thereby the crystal film 140 can be grown so that the continuous c-plane is formed on the contact portion of the adjacent seed crystal substrates 110, and so that the formation of irregularities (V-grooves) is suppressed.

A Second Modified Example of the First Embodiment

Next, a method for manufacturing a nitride crystal substrate according to a second modified example of the first embodiment will be described, with reference to FIG. 5.

Figure 5:
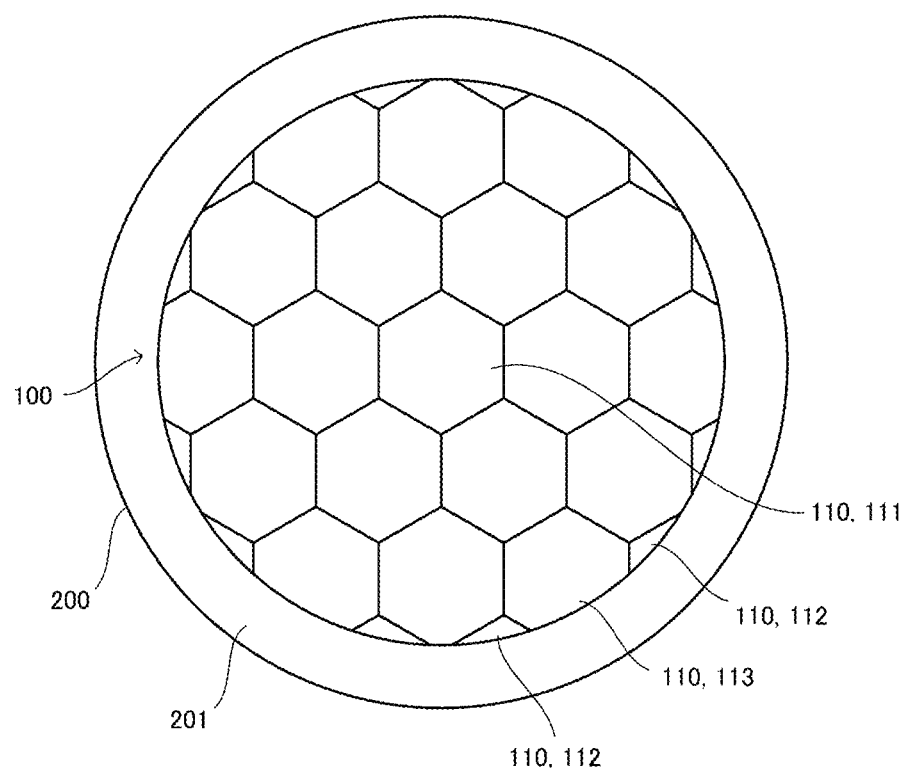
FIG. 5 is a schematic planar view showing a seed crystal substrate assembly placed on a base plate in a second modified example of a first embodiment.

FIG. 5 is a schematic planar view showing the seed crystal substrate assembly 100 placed on the base plate 200 according to the second modified example.

An example shown in FIG. 5 is another example of a pattern of the seed crystal substrate assembly 100. Namely, FIG. 5 shows another example of a pattern in which a configuration of tessellating the regular-hexagonal seed crystal substrates 110 in a planar appearance, is circulary cut with a center of a predetermined seed crystal substrate 110 (111) as a center, and a pattern constituted so that fan-shaped seed crystal substrates 110 (112) are placed at every other positions in the seed crystal substrates 110 arranged along the circumference which is the outer peripheral edge of the seed crystal substrate assembly 100. The term of "fan-shape" means a shape obtained by connecting two sides which define a center angle by arc-shaped curve line, and includes a case that lengths of two sides which define a center angle are not equal.

Thus, the pattern of the seed crystal substrate assembly 100 is not limited to the pattern shown in FIG. 1, and for example, may be a pattern such as shown in the second modified example of FIG. 5. For example, the fixing member 211 can be placed so as to be in contact with the fan-shaped seed crystal substrates 112 in the pattern of the second modified example, when applied to the first embodiment. Further, for example, the fan-shaped seed crystal substrate 112 in the pattern of the second modified example can be used as the seed crystal substrate for fixing 212, when applied to the first modified example of the first embodiment.

A Third Modified Example of the First Embodiment

Next, a method for manufacturing a nitride crystal substrate according to a third modified example of the first embodiment will be described, with reference to FIG. 6A and FIG. 6B.

Figure 6A:
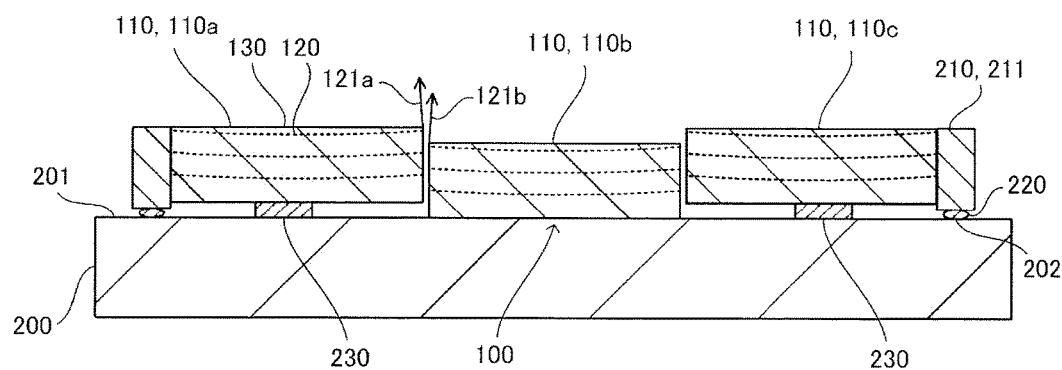
FIG. 6A is a schematic cross-sectional view showing a seed crystal substrate assembly placed on a base plate in a third modified example of a first embodiment.

FIG. 6A is a schematic cross-sectional view showing the seed crystal substrate assembly 100 placed on the base plate 200. FIG. 6B is a schematic cross-sectional view showing a state of forming the crystal film 140 on the seed crystal substrate assembly 100.

As described above, by allowing the movement of the seed crystal substrate 110 toward the inclination direction, the crystal film 140 can be grown in a state of reducing the mismatching between the c-axis directions of the adjacent seed crystal substrates 110. In the abovementioned first embodiment, as shown in FIG. 2B, the movement of the seed crystal substrate 110a, etc., toward the inclination direction occurs so that the outer peripheral side portion is lifted with respect to a central side portion where height does not change. Namely, the movement toward the inclination direction is simply an upward movement.

The third modified example is a modified example in which a spacer 230 for facilitating the movement of the seed crystal substrate 110 toward the inclination direction, is provided under the substrate 110 which moves toward the inclination direction. Explanation will be given hereafter in detail.

Figure 6B:
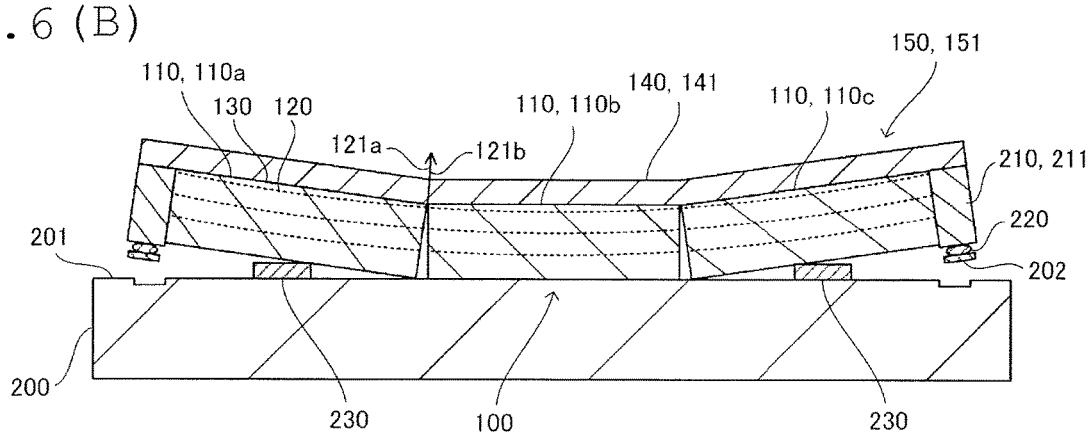
FIG. 6B is a schematic cross-sectional view showing a state of forming a crystal film on a seed crystal substrate assembly in a third modified example of a first embodiment.

As shown in FIG. 6A and FIG. 6B, the spacer 230 is provided on the base plate 200 so as to be interposed between the base plate 200 and the seed crystal substrate 110, and the seed crystal substrate 110 is placed non-adhesively on the spacer 230. At the time of constituting the seed crystal substrate assembly 100 on the base plate 200, the seed crystal substrate 110a and the like placed on the spacer 230, is placed in a horizontal posture (before moving toward the inclination direction).

The spacer 230 is constituted as a member narrower than the seed crystal substrate 110a, etc., which moves toward the inclination direction, in a direction of a largest inclination when moving toward the inclination direction, namely, in a direction of connecting a central side and an outer peripheral side of the seed crystal substrate assembly 100. Width, height, planer shape, in-plane placing position, or in-plane placing direction, etc., of the spacer 230, can be suitably adjusted so as to match a posture after the seed crystal substrate 110a and the like placed thereon is inclined.

By constituting the spacer 230 as a narrow member described above, the seed crystal substrate 110a and the like placed thereon can be moved toward the inclination direction so as to lift the outer peripheral side portion by sink of the central side portion downward. Namely, the downward movement using gravity can be utilized as the movement toward the inclination direction. As a result, when growing the crystal film 140, the autonomous movement of the seed crystal substrate 110a, etc., toward the inclination direction can easily occur, compared to a case in which the seed crystal substrate 110a, etc., is placed on the base plate 200 without interposing the spacer 230.

A Second Embodiment of the Present Disclosure

Next, a method for manufacturing a nitride crystal substrate according to a second embodiment will be described, with reference to FIG. 7A and FIG. 7B.

Figure 7A:
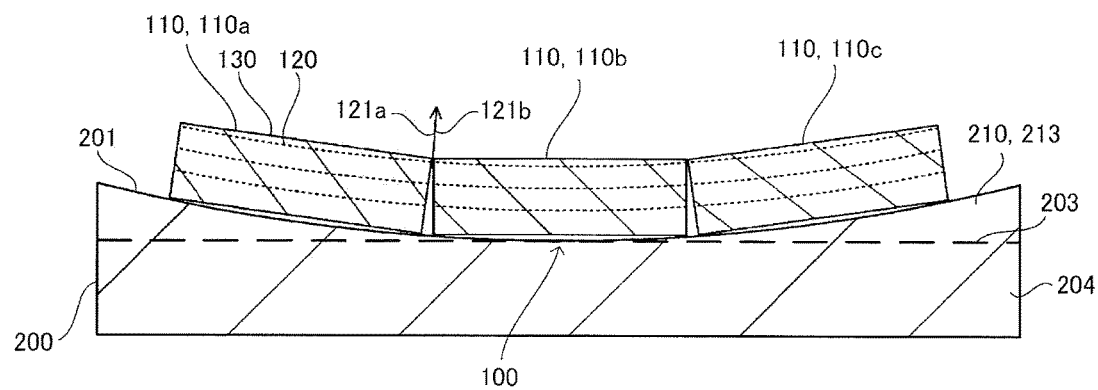
FIG. 7A is a schematic cross-sectional view showing a seed crystal substrate assembly placed on a base plate in a second embodiment.

FIG. 7A is a schematic cross-sectional view showing the seed crystal substrate assembly 100 placed on the base plate 200. FIG. 7B is a schematic cross-sectional view showing a state of forming the crystal film 140 on the seed crystal substrate assembly 100.

In the examples described in the first embodiment, the first modified example thereof, and the third modified example thereof, each seed crystal substrate 110 is placed in a horizontal posture at the time of constituting the seed crystal substrate assembly 100 on the base plate 200. Namely, the adjacent seed crystal substrates 110 are placed in a state in which the c-axis directions are largely mismatched.

On the other hand, the c-planes of each seed crystal substrate 110 are placed on the same spherical surface by moving each seed crystal substrate 110 toward the inclination direction (as necessary), after growing the crystal film 140.

The second embodiment is an embodiment in which the autonomous movement of the seed crystal substrate 110 toward the inclination direction is reduced by previously constituting the seed crystal substrate assembly 100 so that the c-planes of each seed crystal substrate 110 after growing the crystal film 140 are in a state close to a state of being placed on the same spherical surface. Explanation will be given hereafter in detail.

Figure 7B:
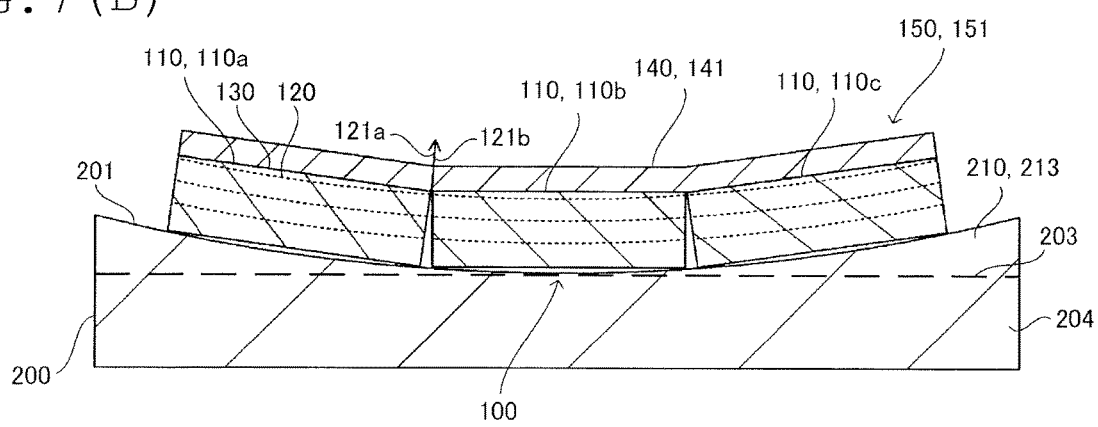
FIG. 7B is a schematic cross-sectional view showing a state of forming a crystal film on a seed crystal substrate assembly in a second embodiment.

As shown in FIG. 7A and FIG. 7B, the base plate 200 in the second embodiment has the placing surface 201 which is downwardly convex spherical curved surface. By setting a curvature radius of the curved surface of the placing surface 201 to a value close to a curvature radius of the c-plane of the seed crystal substrate 110, it is possible to constitute the seed crystal substrate assembly 100 in a state close to a state in which the c-planes of each seed crystal substrate 110 are placed on the same spherical surface, when each seed crystal substrate 110 is placed on the base plate 200. Namely, when growing the crystal film 140, the autonomous movement of the seed crystal substrate 110 toward the inclination direction can be reduced.

A portion constituting the placing surface 201, which protrude upward from a virtual horizontal surface 203 of the base plate 200 in the second embodiment, is called an inclination support member 213. The base plate 200 in the second embodiment can be regarded as having a configuration in which the inclination support member 213 is provided on a base member 204 which constitutes a part under the horizontal surface 203.

The inclination support member 213 supports the seed crystal substrate 110a and the like placed on (at least) the outer peripheral edge portion of the seed crystal substrate assembly 100 in a posture inclined so that the outer peripheral side of the substrate 110a becomes higher. The inclination support member 213 has a function of making the c-planes of each seed crystal substrate 110 close to a state of being placed on the same spherical surface as described above, and a function as the position regulating unit 210 as described later. Further, all seed crystal substrates 110 constituting the seed crystal substrate assembly 100 are placed non-adhesively on the base plate 200, due to use of the inclination support member 213 as the position regulating unit 210.

The inclination support member 213 supports the seed crystal substrate 110a and the like placed on (at least) the outer peripheral edge portion of the seed crystal substrate assembly 100 in the posture inclined so that the outer peripheral side becomes higher. As a result, a force which is attracted toward the central side of the seed crystal substrate assembly 100 along the placing surface 201, is added on the seed crystal substrate 110a and the like placed in the inclined posture due to gravity. Thereby, even when the seed crystal substrate 110a and the like placed in the inclined posture, and other seed crystal substrate 110 which is placed on the central side, and which is in direct or indirect contact with the seed crystal substrate 110a, etc., are placed non-adhesively, the movement toward the outer peripheral side direction is regulated, and therefore the positions in the in-plane direction are regulated. Thus, the inclination support member 213 functions as the position regulating unit 210.

In the second embodiment, the inclination support member 213, namely, the base plate 200 itself for placing the seed crystal substrate 110 functions as the position regulating unit 210. Thereby, it is not necessary to use the adhesive agent 220 as described in the first embodiment and the first modified example thereof in order to constitute the position regulating unit 210.

Further, since the adhesive agent 220 is not used, it is not necessary to release the adhesion of the position regulating unit 210 by peeling off the surface layer 202 of the base plate 200. Therefore, it is possible to obtain a high freedom degree of selecting a material constituting the base plate 200 in the second embodiment. For example, sintered silicon carbide (SiC), SiC-coated graphite, pyrolytic graphite, etc., can be used as the material constituting the base plate 200 in the second embodiment. A publicly known machine processing, etc., is appropriately used as a processing of forming the placing surface 201 of the base plate 200.

The spherical curved surface is exemplified as the inclination support member 213 in FIG. 7A and FIG. 7B. However, the inclination support member 213 may have another configuration. For example, it may have a stepped surface instead of the curved surface. Further, for example, the spacer 230 described in the third modified example of the first embodiment may be utilized as the inclination support member 213. Namely, the seed crystal substrate 110 may be placed on the spacer 230 in a previously inclined posture.

In the first embodiment, explanation has been given for steps up to the step of slicing the thick crystal film 140 and obtaining the nitride crystal substrate. In the first and the third modified example of the first embodiment, and the second embodiment, the nitride crystal substrate can be obtained by growing and slicing the thick crystal film 140 having a desired thickness, similarly to the first embodiment.

In the second modified example of the first embodiment, explanation has been given for a case of applying the pattern of the seed crystal substrate assembly 100 according to the second modified example, to the first embodiment and the first modified example thereof. However, the pattern of the seed crystal substrate assembly 100 according to the second modified example may be applied to the third modified example of the first embodiment and the second embodiment.

The method for manufacturing a nitride crystal substrate described in the abovementioned embodiments and modified examples can be regarded as a method for manufacturing a nitride crystal film.

The present disclosure has been described in accordance with the embodiments and the modified examples. However, the present disclosure is not limited thereto, and for example, it is obvious for a skilled-person that various modifications, improvements, combinations, etc., are possible.

EXAMPLE

Explanation will be given for an experiment in which a nitride crystal film is grown according to the first embodiment, with reference to FIG. 8A to FIG. 9C.

Figure 8A:
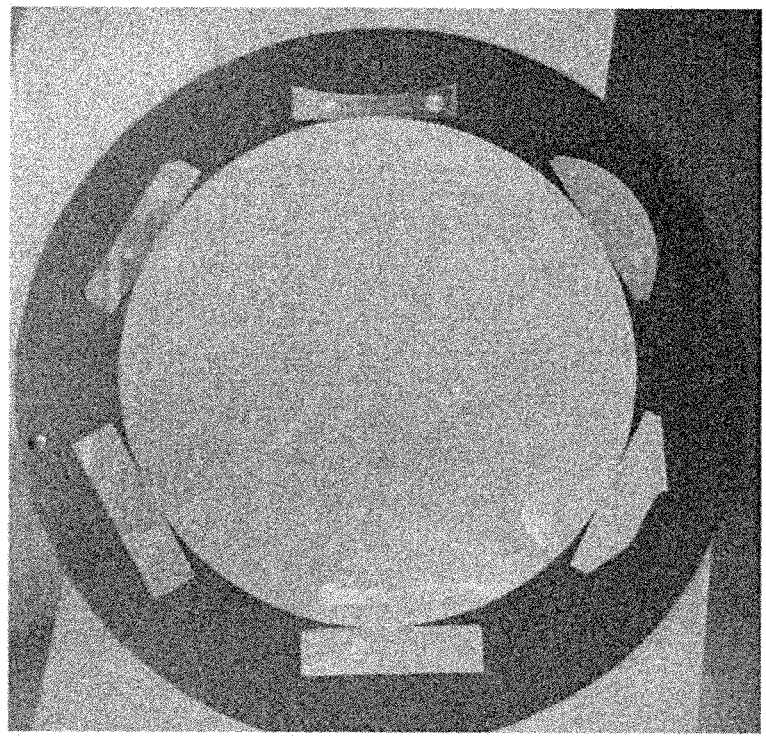
FIG. 8A and FIG. 8B are respectively photographs of a seed crystal substrate assembly placed on a base plate, before or after growing a nitride crystal film, in an experiment in which a nitride crystal film is grown according to a first embodiment.
Figure 8B:
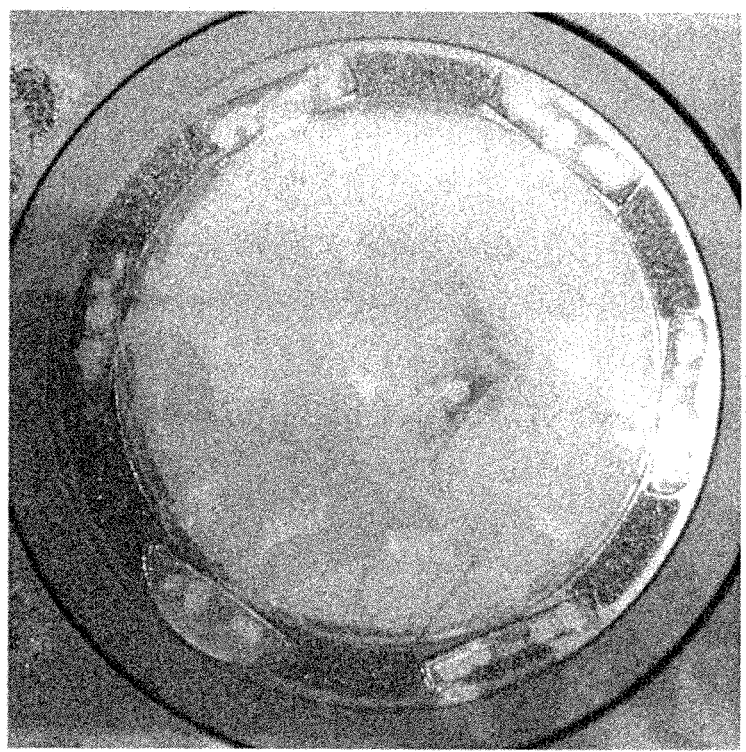

FIG. 8A and FIG. 8B are respectively photographs of a seed crystal substrate assembly placed on a base plate, before or after growing a crystal. A round-shaped seed crystal substrate assembly having a diameter of 125 mm was constituted by using seed crystal substrates which were made of GaN, and were low warpage substrates with curvature radius of the c-planes being 20 meters. A plate having a placing surface constituted of pyrolytic graphite was used as the base plate. Fixing members made of GaN end material were placed so as to be in contact with each fan-shaped seed crystal substrate placed on an outer peripheral edge portion of the seed crystal substrate assembly. The fixing members were adhered on the base plate by using Aron Ceramic C agent. Crystal growth was carried out at 1050° C. for 3 hours using a HVPE apparatus, to thereby form a GaN crystal film having a thickness of 1 mm.

Figure 9A:
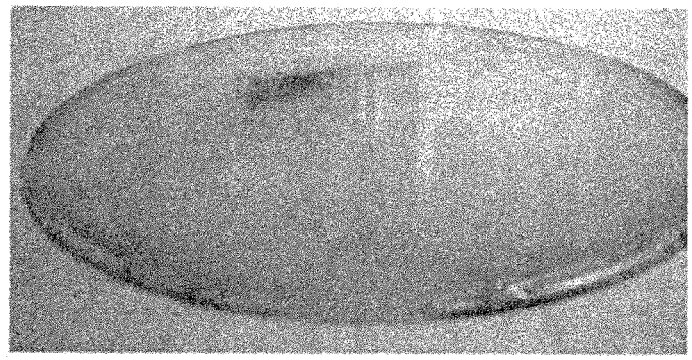
FIG. 9A is a photograph of a crystal film formed on a seed crystal substrate assembly in an experiment in which a nitride crystal film is grown according to a first embodiment.

FIG. 9A is a photograph of the seed crystal substrate assembly which is removed from the base plate and from which the fixing member is removed after growing the crystal film, namely, a photograph of the crystal film formed on the seed crystal substrate assembly. It is found that a surface of the obtained crystal film is formed into a mirror surface with high flatness over an entire surface thereof.

Figure 9B:
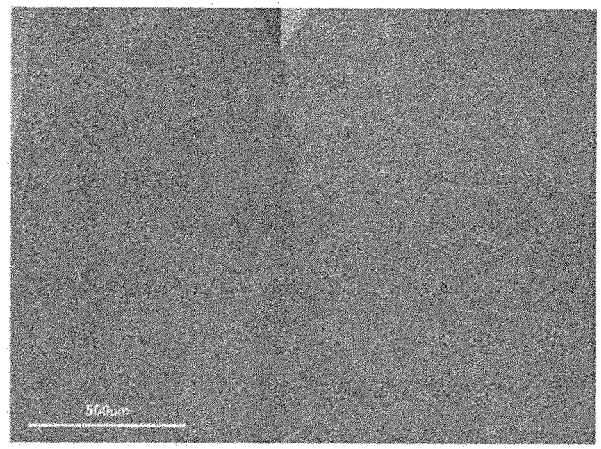
FIG. 9B is a differential interference image of a crystal film grown on a contact portion of adjacent seed crystal substrates in an experiment in which a nitride crystal film is grown according to a first embodiment.

FIG. 9B is a differential interference image of the crystal film grown on a contact portion of the adjacent seed crystal substrates. From the differential interference image of FIG. 9B, it is found that the crystal film on the contact portion is formed with high flatness (into a mirror surface).

Figure 9C:
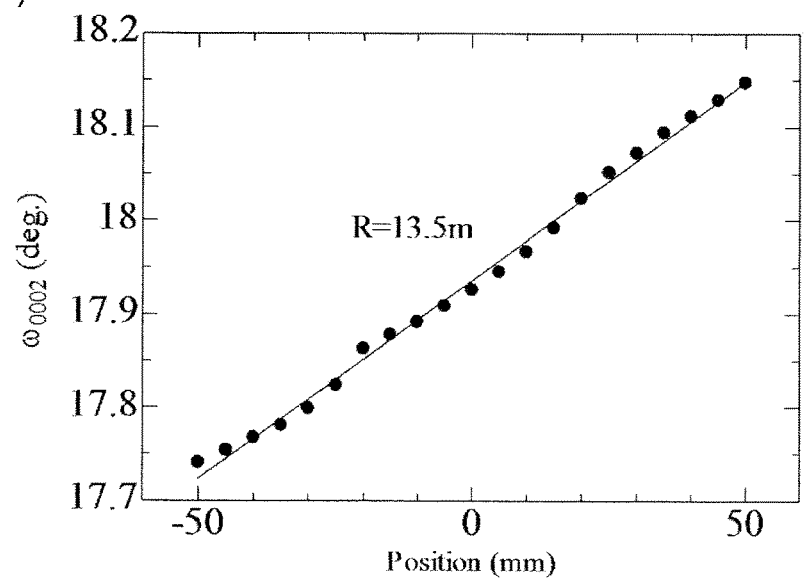
FIG. 9C is a graph showing a measurement result of an X-ray rocking curve of a crystal film grown on a contact portion of adjacent seed crystal substrates in an experiment in which a nitride crystal film is grown according to a first embodiment.

FIG. 9C is a graph showing a measurement result of an X-ray rocking curve of the crystal film grown on the contact portion of the adjacent seed crystal substrates. It is found that a peak angle changes continuously on the contact portion of the adjacent seed crystal substrates over a surface from one seed crystal substrate to other seed crystal substrate. Namely, it is found that the crystal film is grown so that a continuous c-plane is formed on the contact portion of the adjacent seed crystal substrates.

Thus, according to this experiment, it is found that a crystal film having a large diameter and a large area, and having a high quality of having a continuous c-plane over the entire surface of the seed crystal substrate assembly and suppressing irregularities on the surface, can be obtained.

PREFERABLE ASPECTS OF THE PRESENT DISCLOSURE

Preferable aspects of the present disclosure will be supplementarily described hereafter.
[Supplementary Description 1]
There is provided a method for manufacturing a nitride crystal substrate (a method for manufacturing a nitride crystal film) including:
a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and
a second step of growing a crystal film on the seed crystal substrate assembly,
wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate.
[Supplementary Description 2]
There is provided a method for manufacturing a nitride crystal substrate of the supplementary description 1, wherein
a fixing member is used as the position regulating unit, which is placed on the base plate so as to be in contact with an outer peripheral edge surface of the seed crystal substrate assembly, and which is adhered to a surface layer of the base plate, and
a material constituting the base plate is a material with which the adhered fixing member is separated from the base plate by peeling off the surface layer.

[Supplementary Description 3]

There is provided a method for manufacturing a nitride crystal substrate of the supplementary description 2, wherein the fixing member includes a first fixing member which is in contact with a first seed crystal substrate placed on an outer peripheral edge portion of the seed crystal substrate assembly, and a second fixing member which is in contact with a second seed crystal substrate placed on the outer peripheral edge portion of the seed crystal substrate assembly, the first seed crystal substrate and the second seed crystal substrate are placed along an outer peripheral edge of the seed crystal substrate assembly, so that the seed crystal substrate which is not in contact with the fixing member, is interposed between the first seed crystal substrate and the second seed crystal substrate, and movement of the seed crystal substrate which is not in contact with the fixing member toward an outer peripheral side direction of the seed crystal substrate assembly, is regulated by locking the seed crystal substrate which is not in contact with the fixing member, with the first seed crystal substrate whose movement toward the outer peripheral side direction of the seed crystal substrate assembly is regulated by the first fixing member and the second seed crystal substrate whose movement toward the outer peripheral side direction of the seed crystal substrate assembly is regulated by the second fixing member.

[Supplementary Description 4]

There is provided a method for manufacturing a nitride crystal substrate of the supplementary description 3, wherein in the first step, the seed crystal substrate assembly is constituted of a pattern in which a configuration of tessellating regular-hexagonal seed crystal substrates in a planar appearance, is circulary cut with a center of a predetermined regular-hexagonal seed crystal substrate as a center, the pattern is a pattern in which fan-shaped seed crystal substrates are placed at every other positions in the seed crystal substrates arranged along a circumference which is the outer peripheral edge of the seed crystal substrate assembly, and the first seed crystal substrate and the second seed crystal substrate are constituted of the fan-shaped seed crystal substrates.

[Supplementary Description 5]

There is provided a method for manufacturing a nitride crystal substrate of the supplementary description 1, wherein a seed crystal substrate for fixing is used as the position regulating unit, which is the seed crystal substrate placed on an outer peripheral edge portion of the seed crystal substrate assembly and adhered to a surface layer of the base plate, and a material constituting the base plate is a material with which the adhered seed crystal substrate for fixing is separated from the base plate by peeling off the surface layer.

[Supplementary Description 6]

There is provided a method for manufacturing a nitride crystal substrate of the supplementary description 5, wherein the seed crystal substrate for fixing includes a first seed crystal substrate for fixing and a second seed crystal substrate for fixing, the first seed crystal substrate for fixing and the second seed crystal substrate for fixing are arranged along an outer peripheral edge of the seed crystal substrate assembly, so that the seed crystal substrate placed non-adhesively to the base plate is interposed between the first seed crystal substrate for fixing and the second seed crystal substrate for fixing, and movement of the seed crystal substrate placed non-adhesively toward an outer peripheral side direction of the seed crystal substrate assembly, is regulated by locking the seed crystal substrate placed non-adhesively, with the first seed crystal substrate for fixing and the second seed crystal substrate for fixing.

[Supplementary Description 7]

There is provided a method for manufacturing a nitride crystal substrate of the supplementary description 6, wherein in the first step, the seed crystal substrate assembly is constituted a pattern in which a configuration of tessellating regular-hexagonal seed crystal substrates in a planar appearance, is circulary cut with a center of a predetermined seed crystal substrate as a center, the pattern is a pattern in which fan-shaped seed crystal substrates are placed at every other positions in the seed crystal substrates arranged along a circumference which is an outer peripheral edge of the seed crystal substrate assembly, and the first seed crystal substrate for fixing and the second seed crystal substrate for fixing are constituted of the fan-shaped seed crystal substrates.

[Supplementary Description 8]

There is provided a method for manufacturing a nitride crystal substrate of any one of the supplementary descriptions 1 to 7, wherein a spacer for placing non-adhesively the seed crystal substrates thereon, is provided on the base plate, so as to be interposed between the base plate and the seed crystal substrates, and the spacer is constituted so that the seed crystal substrate is easily moved in its inclination direction in the second step, compared to a case in which the seed crystal substrates are placed on the base plate without interposing the spacer.

[Supplementary Description 9]

There is provided a method for manufacturing a nitride crystal substrate of any one of the supplementary descriptions 1 to 8, wherein an inclination support member is used as the position regulating unit to support the seed crystal substrates placed on the outer peripheral edge portion of the seed crystal substrate assembly in a posture inclined so that the outer peripheral side of the seed crystal substrates placed on the outer peripheral edge portion of the seed crystal substrate assembly becomes higher.

[Supplementary Description 10]

There is provided a method for manufacturing a nitride crystal substrate of any one of the supplementary descriptions 1 to 9, wherein each of the plurality of seed crystal substrates is a low warpage substrate with a curvature radius of the c-plane being 20 meters or more.

[Supplementary Description 11]

There is provided a nitride crystal laminate including:

a seed crystal substrate assembly constituted by arranging and placing a plurality of seed crystal substrates which are made of nitride crystal and whose principal surfaces are c-planes, so that side surfaces of the adjacent seed crystal substrates are in contact with each other; and a crystal film grown on the seed crystal substrate assembly, wherein the crystal film is grown so that a continuous c-plane is formed on a contact portion of the adjacent seed crystal substrates.

What is claimed is:

1. A method for manufacturing a nitride crystal substrate comprising:

a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and a second step of growing a crystal film on the seed crystal substrate assembly, wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate, wherein a fixing member is used as the position regulating unit, which is placed on the base plate so as to be in contact with an outer peripheral edge surface of the seed crystal substrate assembly, and which is adhered to a surface layer of the base plate, and a material constituting the base plate is a material with which the adhered fixing member is separated from the base plate by peeling off the surface layer, wherein the fixing member includes a first fixing member which is in contact with a first seed crystal substrate placed on an outer peripheral edge portion of the seed crystal substrate assembly, and a second fixing member which is in contact with a second seed crystal substrate placed on the outer peripheral edge portion of the seed crystal substrate assembly, the first seed crystal substrate and the second seed crystal substrate are placed along an outer peripheral edge of the seed crystal substrate assembly, so that a seed crystal substrate which is not in contact with the fixing member, is interposed between the first seed crystal substrate and the second seed crystal substrate, and movement of the seed crystal substrate which is not in contact with the fixing member toward an outer peripheral side direction of the seed crystal substrate assembly, is regulated by locking the seed crystal substrate which is not in contact with the fixing member, with the first seed crystal substrate whose movement toward the outer peripheral side direction of the seed crystal substrate assembly is regulated by the first fixing member and the second seed crystal substrate whose movement toward the outer peripheral side direction of the seed crystal substrate assembly is regulated by the second fixing member, and wherein in the first step, the seed crystal substrate assembly is constituted of a pattern in which a configuration of tessellating regular-hexagonal seed crystal substrates in a planar appearance, is circulary cut with a center of a predetermined regular-hexagonal seed crystal substrate as a center, the pattern is a pattern in which fan-shaped seed crystal substrates are placed at every other positions in the seed crystal substrates arranged along a circumference which is the outer peripheral edge of the seed crystal substrate assembly, and the first seed crystal substrate and the second seed crystal substrate are constituted of the fan-shaped seed crystal substrates.

2. A method for manufacturing a nitride crystal substrate comprising:

a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and a second step of growing a crystal film on the seed crystal substrate assembly, wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate, wherein a seed crystal substrate for fixing is used as the position regulating unit, which is the seed crystal substrate placed on an outer peripheral edge portion of the seed crystal substrate assembly and adhered to a surface layer of the base plate, and a material constituting the base plate is a material with which the adhered seed crystal substrate for fixing is separated from the base plate by peeling off the surface layer, wherein the seed crystal substrate for fixing includes a first seed crystal substrate for fixing and a second seed crystal substrate for fixing, the first seed crystal substrate for fixing and the second seed crystal substrate for fixing are arranged along an outer peripheral edge of the seed crystal substrate assembly, so that a seed crystal substrate placed non-adhesively to the base plate is interposed between the first seed crystal substrate for fixing and the second seed crystal substrate for fixing, and movement of the seed crystal substrate placed non-adhesively toward an outer peripheral side direction of the seed crystal substrate assembly, is regulated by locking the seed crystal substrate placed non-adhesively, with the first seed crystal substrate for fixing and the second seed crystal substrate for fixing, and wherein in the first step, the seed crystal substrate assembly is constituted a pattern in which a configuration of tesselating regular-hexagonal seed crystal substrates in a planar appearance, is circulary cut with a center of a predetermined seed crystal substrate as a center, the pattern is a pattern in which fan-shaped seed crystal substrates are placed at every other positions in the seed crystal substrates arranged along a circumference which is an outer peripheral edge of the seed crystal substrate assembly, and the first seed crystal substrate for fixing and the second seed crystal substrate for fixing are constituted of the fan-shaped seed crystal substrates.

3. A method for manufacturing a nitride crystal substrate comprising:

a first step of constituting a seed crystal substrate assembly by arranging and placing a plurality of seed crystal substrates which are made of nitride crystal and whose principal surfaces are c-planes, on a base plate so that side surfaces of the adjacent seed crystal substrates are in contact with each other; and a second step of growing a crystal film on the seed crystal substrate assembly, wherein in the first step, the seed crystal substrates are placed on the base plate in a state of regulating a position of the seed crystal substrates in an in-plane direction by a position regulating unit to regulate the position of the seed crystal substrates in the in-plane direction, and at least one of the seed crystal substrates is placed non-adhesively to the base plate, wherein an inclination support member is used as the position regulating unit to support the seed crystal substrates placed on the outer peripheral edge portion of the seed crystal substrate assembly in a posture inclined so that the outer peripheral side of the seed crystal substrates placed on the outer peripheral edge portion of the seed crystal substrate assembly becomes higher.

4. A method for manufacturing a nitride crystal substrate according to claim 1, wherein each of the plurality of seed crystal substrates is a low warpage substrate with a curvature radius of the c-plane being 20 meters or more.

5. A method for manufacturing a nitride crystal substrate according to claim 2, wherein each of the plurality of seed crystal substrates is a low warpage substrate with a curvature radius of the c-plane being 20 meters or more.

6. A method for manufacturing a nitride crystal substrate according to claim 3, wherein each of the plurality of seed crystal substrates is a low warpage substrate with a curvature radius of the c-plane being 20 meters or more.

* * * * *